United States Patent
Teboulle

(10) Patent No.: US 12,261,551 B2
(45) Date of Patent: Mar. 25, 2025

(54) AC SUPPLY FLUID METER

(71) Applicant: SAGEMCOM ENERGY & TELECOM SAS, Bois-Colombes (FR)

(72) Inventor: Henri Teboulle, Bois-Colombes (FR)

(73) Assignee: SAGEMCOM ENERGY & TELECOM SAS, Bois-Colombes (FR)

( * ) Notice: Subject to any disclaimer, the term of this patent is extended or adjusted under 35 U.S.C. 154(b) by 0 days.

(21) Appl. No.: 18/640,683

(22) Filed: Apr. 19, 2024

(65) Prior Publication Data

US 2024/0356463 A1    Oct. 24, 2024

(30) Foreign Application Priority Data

Apr. 21, 2023    (FR) ........................... 2304059

(51) Int. Cl.
*H02N 11/00* (2006.01)
*G01F 15/063* (2022.01)

(52) U.S. Cl.
CPC ......... *H02N 11/002* (2013.01); *G01F 15/063* (2013.01)

(58) Field of Classification Search
CPC ............................. H02N 11/002; G01F 15/063
USPC ........................................................... 73/198
See application file for complete search history.

(56) References Cited

U.S. PATENT DOCUMENTS

| | | | |
|---|---|---|---|
| 9,194,271 B2 * | 11/2015 | Willats | F01N 5/025 |
| 2006/0063044 A1 | 3/2006 | DeVries | |
| 2010/0104896 A1 | 4/2010 | Johnson et al. | |
| 2013/0005372 A1 * | 1/2013 | Strei | F28D 15/0275 455/500 |
| 2017/0211450 A1 * | 7/2017 | Sugimoto | H10N 10/13 |
| 2019/0086233 A1 * | 3/2019 | Comfort | G01F 15/063 |
| 2022/0155111 A1 * | 5/2022 | Redmond | G01F 15/00 |

FOREIGN PATENT DOCUMENTS

| JP | 2002270908 A | 9/2002 |
|---|---|---|
| WO | WO-2016140035 A1 | 9/2016 |

OTHER PUBLICATIONS

Search Report Issued in FR 2304059, dated Oct. 17, 2023.
French Patent Application No. FR2304059, Written Opinion on the Patentability of the Invention, mailed Oct. 23, 2023.

* cited by examiner

*Primary Examiner* — Nathaniel T Woodward
(74) *Attorney, Agent, or Firm* — MARSHALL, GERSTEIN & BORUN LLP

(57) ABSTRACT

This fluid meter configured to perform metrological measurements in a fluid circulation pipe and to communicate information relating to said metrological data, includes:
  a pipe,
  a metrological sensor,
  a control block,
  a power supply block configured to power the control block, the power supply block including a first supply path including at least one primary cell, and a second supply path, and further including a first switch configured to selectively couple the first supply path or the second supply path to the control block, the fluid meter including a thermoelectric generator configured to produce electricity from a temperature difference between an exterior of the pipe and the fluid in the pipe, the second supply path being connected to the thermoelectric generator.

15 Claims, 4 Drawing Sheets

AC SUPPLY FLUID METER

CROSS REFERENCE TO RELATED APPLICATIONS

The benefit of priority to French Patent Application No. 2304059 filed Apr. 21, 2023 is hereby claimed and the disclosure is incorporated herein by reference in its entirety.

TECHNICAL FIELD

The invention belongs to the technical field of fluid meters. A fluid meter is a metrology apparatus configured to perform metrological measurements in a fluid circulation pipe. The fluid can be liquid such as for example water or oil, or gaseous such as for example a gaseous mixture of hydrocarbons mainly consisting of methane such as natural gas. Metrological measurements are generally a volume or a flow rate relating to the fluid circulating in the pipe.

STATE OF THE ART

In order to know some metrological data regarding the circulation of a fluid in a pipe, a fluid meter is commonly used to generate and make metrological measurements available. In order to take these metrological measurements, fluid meters equipped with means for communicating information relating to said metrological data have been developed. These communication means can be adapted for a remote communication, and for example allow wired or non-wired transmission of this information. The communication means can also have several pieces of information in a display, organized according to menus. In all cases, these metrological meters require an electrical supply. However, the meters can be disposed in locations that do not allow easy connection to the electrical network, so that they must have an autonomous electrical supply, not connected to the electrical network.

The simplest way to autonomously supply electricity to a fluid meter is to equip it with an electric primary cell, that is to say a non-rechargeable energy storage element in situ. The energy storage capacity must however be sufficient to allow electrical supply for a long period of time (typically 20 years), which results in the use of very large primary cells. Furthermore, the service life of the primary cell depends on the electrical consumption of the meter, which can significantly reduce the service life of the primary cell, which in any case eventually runs out and must be changed, a tedious operation requiring monitoring of the state of the primary cell.

In order to overcome these drawbacks, it has been proposed to replace the electric primary cell with a rechargeable battery, for example powered by an electric generator configured to be driven by the circulation of the fluid in the pipe and generate electricity recharging the battery.

However, the potentially intermittent aspect of the circulation of the fluid requires having a battery with a significant electrical storage capacity, which results in bulk and high costs. Furthermore, the non-regularity of the fluid circulation episodes can multiply the incomplete charge-discharge cycles of the battery, reducing its performance over time.

DISCLOSURE OF THE INVENTION

The invention therefore aims to propose a fluid meter equipped with an electrical supply with a long service life, less bulky and more reliable.

The invention relates to a fluid meter configured to perform metrological measurements in a fluid circulation pipe and to communicate information relating to said metrological data, comprising:
  a fluid pipe,
  at least one metrological sensor configured to perform metrological measurements in the fluid pipe,
  a control block configured to receive the metrological measurements and to communicate information relating to said metrological data,
  a power supply block configured to supply energy to the control block, the power supply block comprising a first supply path comprising at least one primary cell, and a second supply path, the power supply block further comprising a first switch configured to selectively couple the first supply path or the second supply path to the control block.

The fluid meter comprises a thermoelectric generator configured to produce electricity from a temperature difference between an exterior of the pipe and the fluid in the pipe, the second supply path being connected to the thermoelectric generator.

This device is advantageously supplemented by the following characteristics taken alone or according to their different possible combinations:
  the thermoelectric generator includes one or more thermoelectric modules partially inserted into a wall of the pipe;
  a protrusion is formed on the fluid circulation pipe, the protrusion comprising at least one cavity, each cavity being configured to receive a thermoelectric module;
  the wall of the pipe has a first thickness out of the protrusion, each cavity comprising a protection part and a receiving part, the receiving part being of a diameter smaller than the protection part and being arranged in the wall of the pipe at a distance from the interior of the pipe smaller than the first thickness, each thermoelectric module comprising a first portion configured to be at the temperature of the exterior of the pipe and a second portion configured to be at the temperature of the fluid, the second portion being inserted into the receiving part;
  the thermoelectric generator includes a first external connector in contact with the first portion of a first thermoelectric module disposed at the input of the thermoelectric generator and connecting said first portion to the power supply block, the thermoelectric generator further comprising a second external connector in contact with the second portion of a last thermoelectric module disposed at the output of the thermoelectric generator and connecting said second portion to the power supply block;
  a second portion of a thermoelectric module is connected by an internal connector to the first portion of another thermoelectric module;
  each thermoelectric module is composed of a first thermoelectric material having a first Seebeck coefficient, and a connector in contact with the first portion or the second portion of the thermoelectric module is composed of a second thermoelectric material having a second Seebeck coefficient different from the first Seebeck coefficient;
  the second supply path comprises a capacitor and a second switch configured to selectively couple the capacitor and the thermoelectric generator according to a level of charge of the capacitor;

the level of charge is determined by the control block according to a first correspondence table and to the temperature difference when the capacitor is charging, and according to a second correspondence table and to functions implemented by the control block when the capacitor is discharging;

the control block is configured, at least when the thermoelectric generator generates electricity:

to position the first switch on the second supply path when the level of charge becomes greater than a high threshold;

to position the first switch on the first supply path when the level of charge of the capacitor becomes smaller than a low threshold;

the high threshold is greater than or equal to 80% of a maximum level of charge, and the low threshold is less than or equal to 10% of a maximum level of charge;

the control block is configured to determine a temperature difference between the exterior of the pipe and the fluid and:

to open the second switch when the temperature difference is smaller than a minimum temperature difference threshold;

to close the second switch when the temperature difference is greater than or equal to a minimum temperature difference threshold;

the minimum temperature difference threshold is comprised between 2° C. and 5° C.

The invention also relates to a method for managing the supply of a fluid meter as defined previously, the fluid meter comprising a control block and a power supply block configured to supply energy to the control block, the power supply block comprising a first supply path comprising at least one primary cell, and a second supply path, the power supply block further comprising a first switch configured to selectively couple the first supply path or the second supply path to the control block, the second supply path being connected to a thermoelectric generator configured to produce electricity from a temperature difference between an exterior of the pipe and the fluid in the pipe, the second supply path further comprising a capacitor and a second switch configured to selectively couple the capacitor and the thermoelectric generator according to a level of charge of the capacitor, the method being able to be implemented by the control block and including the following steps:

Switching the first switch on the first supply path,

Determining a temperature difference between an exterior of the pipe and the fluid and, when the determined temperature difference becomes greater than or equal to a minimum threshold, closing the second switch, Estimating a charge current from the temperature difference and a first correspondence table providing an estimation of the associated charge current for each value of the temperature difference, Determining a level of charge of the capacitor in charge from the estimated charge current and, when the estimated level of charge becomes greater than or equal to a predetermined high threshold, switching the first switch on the second supply path, Estimating a discharge current from functions implemented by the control block and a second correspondence table providing for each function implemented by the control block an estimation of the associated discharge current, Determining a level of charge of the capacitor in discharge according to the estimation of the discharge current and, when the estimated level of charge becomes smaller than or equal to a predetermined low charge threshold, repeating the previous steps.

The invention also relates to a computer program product able to be implemented by a control block of a fluid meter as defined previously, comprising instructions which, when the program is executed by the control block, cause the control block to implement the method as defined above.

Finally, the invention also relates to a computer-readable memory storing instructions executable by the computer for the execution of the steps of the method as defined above.

DESCRIPTION OF THE FIGURES

Other characteristics, aims and advantages of the invention will emerge from the following description, which is purely illustrative and not limiting, and which should be read in relation to the appended drawings in which.

In all the figures, similar elements bear identical references.

DETAILED DESCRIPTION OF THE INVENTION

Figure 1:
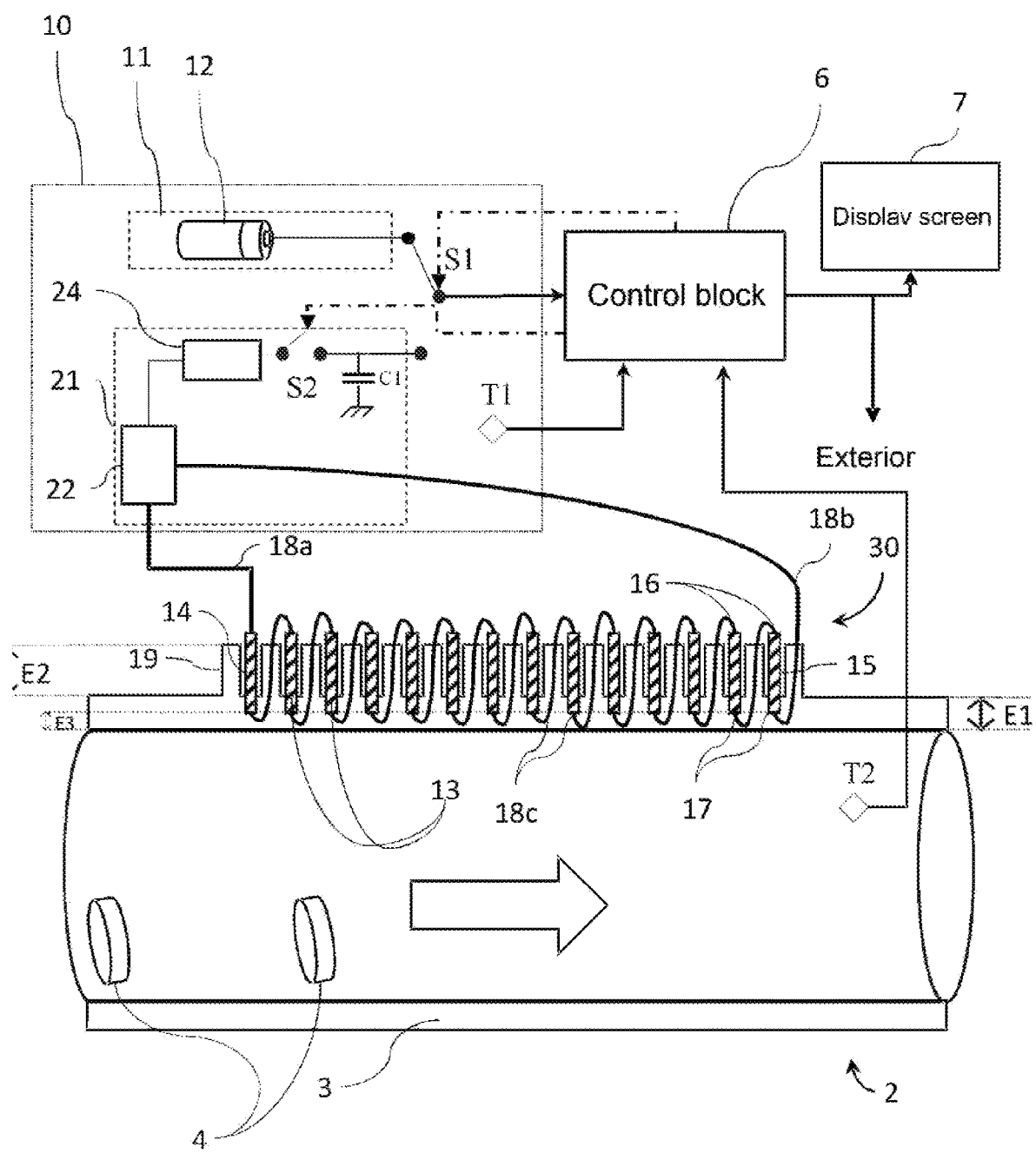
FIG. 1 is a schematic overview of a fluid meter according to one possible embodiment of the invention.

FIG. 1 shows a fluid meter configured to perform metrological measurements regarding a fluid circulating in a fluid circulation pipe 2 defined by a wall 3 separating an interior of the pipe 2 in which the fluid circulates, and an exterior of the pipe 2. The fluid meter is also configured to communicate information relating to said metrological data. Typically, the fluid circulation pipe 2 is part of the fluid meter in the sense that the fluid meter comprises a duct portion in which the fluid circulates, which is integrated into the fluid circulation network. To perform metrological measurements, the fluid meter comprises at least one metrological sensor 4 configured to perform metrological measurements in the fluid pipe 2. The metrological sensor 4 is preferably disposed in the fluid pipe 2. The type of metrological sensor 4 depends on the technology used to perform the measurements, which may be an ultrasonic, an electromagnetic, a thermal or a Coriolis technology. In the example illustrated, two ultrasonic transducers are disposed facing each other in the pipe in order to carry out metrological measurements by ultrasounds, in a known manner. The metrological measurements are generally a volume or a flow rate relating to the fluid circulating in the pipe 2, derived from the data collected by the metrological sensor(s) 4.

The fluid meter comprises a control block 6 comprising at least one processor and one memory, and which is configured to receive the metrological measurements coming from the metrological sensor 4, and to communicate the information relating to said metrological data. Typically, the metrological sensor 4 can be connected to the control block 6, for example by a wired link, and transmits the metrological measurements to the control block 6.

The communication of the information relating to the metrological data is performed by display on a screen and/or by transmission. The fluid meter can thus have a display screen 7 where the information relating to the metrological data can be displayed. The fluid meter can be equipped with a man-machine interface such as a button making it possible to cause the display of this information relating to the metrological data, and possibly to vary this display, for example by making it possible to scroll different types thereof on the display screen 7. The information relating to the metrological data can be transmitted outside the fluid meter, preferably by a non-wired link, in which case the fluid meter can comprise an antenna and any other known element making it possible to establish a remote communication with the fluid meter.

Preferably, the fluid meter complies with the European Union Directive 2014/32/EU regarding the measuring instruments, better known by the acronym MID for "Measuring Instruments Directive". Particularly, the fluid meter must be able to permanently communicate information relating to the metrological data. Likewise, the fluid meter must be able to carry out the metrological measurements at any time. Consequently, the fluid meter must have an electrical supply permanently.

For this purpose, the fluid meter comprises a power supply block 10 configured to permanently supply electricity to the control block 6, and a thermoelectric generator 30 configured to produce electricity from the temperatures of the fluid and the exterior of the pipe 2, the power supply block 10 being coupled to the thermoelectric generator 30. The thermoelectric generator 30 is configured to produce electricity thanks to the Seebeck effect, which is a thermoelectric effect, whereby a potential difference appears at the junction of two materials subjected to a temperature difference.

The power supply block 10 comprises two distinct and independent paths: a first supply path 11 comprising at least one primary cell 12 and a second supply path 21 connected to the thermoelectric generator 30. By "primary cell" it is meant an electrical energy storage element that cannot be recharged, or whose configuration in the power supply block 10 makes the charging within this power supply block 10 impossible. Typically, the first supply path 11 comprises only the primary cell 12. The primary cell 12 preferably has a maximum energy reserve of less than 100 Wh, such as for example 30.6 Wh (8.5 Ah on 3.6 V) or 68.4 Wh (19 Ah on 3.6 V).

The power supply block 10 comprises a first switch S1 configured to selectively couple the first supply path 11 or the second supply path 21 to the control block 6, thus selecting whether the control block 6 is electrically powered by the first supply path 11 or the second supply path 21.

The second supply path 21 further comprises a capacitor C1 and a second switch S2 configured to selectively couple or decouple the capacitor C1 and the thermoelectric generator 30. The capacitor C1 preferably has a maximum energy reserve $E_{max}$ greater than or equal to 0.5 Wh, and even preferably greater than or equal to 0.8 Wh. For example, the capacitor C1 can deliver an electric charge of 0.222 Ah on 3.6 V. The capacitor C1 is preferably a supercapacitor. Typically, the capacitor C1 can be a hybrid layer supercapacitor, or HLC for Hybrid Layer Capacitor, but can also be any type of supercapacitor making it possible to offer a maximum energy reserve $E_{max}$ greater than or equal to 0.5 Wh. Preferably, the maximum energy $E_{max}$ of the capacitor C1 is less than at least 20 times the maximum energy of the primary cell 12.

The second switch S2 is disposed between the capacitor C1 and the thermoelectric generator 30. The second switch S2 is controlled by the control block 6 for its opening and its closure. The second switch S2 is preferably a relay, for example an electromechanical relay.

The second supply path 21 can comprise, in series between the thermoelectric generator 30 and the second switch S2, different current shaping elements, and for example a rectifier 22 in series with a voltage regulator 24. In the example illustrated, a first terminal of the capacitor C1 is connected between the first switch S1 and the second switch S2, and a second terminal of the capacitor C1 is connected to a reference potential (example: the ground).

The control block 6 is configured to determine a temperature difference $\Delta T$ between the exterior of the pipe 2, whose temperature is denoted $T_{amb}$, and the fluid, whose temperature is denoted $T_{fluid}$ ($\Delta T = T_{amb} - T_{fluid}$). More specifically, the control block 6 determines the temperature difference $\Delta T$ from temperature measurements carried out by a first temperature sensor T1 configured to measure the temperature $T_{amb}$ of the exterior of the pipe 2, typically the ambient air, and by a second temperature sensor T2 configured to measure the temperature $T_{fluid}$ of the fluid, the first and second temperature sensors T1 and T2 being connected to the control block 6 to transmit their respective measurements. The temperature sensors T1, T2 are for example thermocouples. The second sensor T2 is for example embedded in the wall of the pipe 2, and/or can be in contact with the fluid.

The thermoelectric generator 30 includes one or more thermoelectric modules 13, preferably identical and connected together in series. In other words, the thermoelectric modules 13 form a chain of thermoelectric modules extending between a first thermoelectric module 14 and a last thermoelectric module 15.

In the case where the thermoelectric generator 30 comprises only one thermoelectric module 13, this module 13 is both the first module 14 and the last module 15 of the thermoelectric chain.

Each thermoelectric module 13, 14, 15 comprises a first portion 16 configured to be disposed at the level of the exterior of the pipe 2 and a second portion 17 configured to be disposed at the level and near the fluid. More specifically, the first portion 16, respectively the second portion 17, is configured to be at the temperature $T_{amb}$ of the exterior of the pipe 2, respectively at the temperature $T_{fluid}$ of the fluid. In one embodiment, the first portion 16 comprises a first end of the module 13, 14, 15, and/or the second portion 17 comprises a second end of the module 13, 14, 15. Preferably, the thermoelectric modules 13, 14, 15 are cylindrical, and for example tubular of constant diameter, so as to facilitate their installation.

The thermoelectric generator 30 further includes a first external connector 18a in contact with the first portion 16 of the first thermoelectric module 14 and connecting said first portion 16 of the first thermoelectric module 14 to the power supply block 10.

The thermoelectric generator 30 also comprises a second external connector 18b in contact with the second portion 17 of the last thermoelectric module 15 and connecting this second portion 17 of the last thermoelectric module 15 to the power supply block 10. Typically, the first external connector 18a and the second external connector 18b are wires fixed, for example by welding, to a thermoelectric module 14, 15.

More specifically, in one embodiment, the first and second external connectors 18a, 18b respectively connect the first portion 16 of the first module 14 and the second portion 17 of the last module 15 to the rectifier 22.

In one embodiment, the external connectors 18a, 18b are connected to the power supply block 10 via intermediate electrical connections. Alternatively, the external connectors 18a, 18b extend to the power supply block 10.

Furthermore, the second portions 17 of each thermoelectric module 13, 14 apart from the last module 15, are connected by an internal connector 18c to the first portion 16 of another thermoelectric module 13, 15. The internal connector 18c is thus in contact with the connected first and second portions 16, 17.

For example, the contact of the external connectors 18a, 18b and of the internal connectors 18c to their respective thermoelectric modules 13, 14, 15 is made by welding. The internal connectors 18c are for example metal wires.

In one embodiment, the external 18a, 18b and internal 18c connectors are identical.

The thermoelectric modules 13, 14, 15 are composed of a first conductive thermoelectric material having a first given Seebeck coefficient $S_A$. In addition, the external 18a, 18b and internal 18c connectors are composed of a second conductive thermoelectric material having a second given Seebeck coefficient $S_B$ different from the first Seebeck coefficient $S_A$.

In the case where the fluid meter is intended to be disposed in an environment in which the temperature $T_{amb}$ of the exterior of the pipe is generally higher than the temperature of the fluid $T_{fluid}$ (by generally, it is meant at least 50% of the time), that is to say for example in the case of a cold water meter disposed inside a building, the first and second thermoelectric materials are chosen so that the second Seebeck coefficient $S_B$ is greater than the first Seebeck coefficient $S_A$, and preferably greater by at least 2 or 4 µV/K. Thus in such a case, the first Seebeck coefficient $S_A$ is preferably relatively low, for example negative, while the second Seebeck coefficient $S_B$ is preferably relatively high, for example positive. For example in such a case, the first thermoelectric material is aluminum, iron, or molybdenum oxide, and the second thermoelectric material is copper, nickel, strontium titanate or is a solid polyelectrolyte.

On the contrary, in the case where the fluid meter intended to be disposed in an environment in which the temperature $T_{amb}$ of the exterior of the pipe is generally lower than the temperature of the fluid $T_{fluid}$ (by generally, it is meant at least 50% of the time), that is to say for example in the case of a hot water meter, the first and second thermoelectric materials are chosen so that the second Seebeck coefficient $S_B$ is smaller than the first Seebeck coefficient $S_A$, and preferably smaller by at least 2 or 4 µV/K. Thus, for example in such a case, the first thermoelectric material forming the thermoelectric modules 13, 14, 15 is copper, nickel, strontium titanate or is a solid polyelectrolyte, and for example, the second thermoelectric material forming the external 18a, 18b and internal 18c connectors is aluminum, iron, or molybdenum oxide.

In any case, in all cases, the second Seebeck coefficient $S_B$ is different from the first Seebeck coefficient $S_A$, and preferably different by at least 2 or 4 µV/K at least, so that a potential difference $\Delta V$ is generated within each module 13, 14, 15 between the first portion 16 and the second portion 17 due to the contact between said portions 16, 17 and the connectors 18a, 18b, 18c when there is a temperature difference $\Delta T$ between the temperature $T_{amb}$ of the exterior of the pipe 2 and the temperature of the fluid $T_{fluid}$ ($\Delta T = T_{amb} - T_{fluid}$). The potential difference between the two contact points between a thermoelectric module 13, 14, 15 and connectors 18a, 18b, 18c, that is to say between the first and second portions 16 and 17, is defined by the following relation:

$$\Delta V = (S_B - S_A) \times \Delta T$$

Thus, in all the cases described above, the thermodynamic materials are chosen so that the potential difference between the two contact points between a thermoelectric module 13, 14, 15 and connectors 18a, 18b, 18c generally remains positive (at least 50% of the time, as long as the temperature difference $\Delta T$ between the temperature $T_{amb}$ of the exterior of the pipe 2 and the temperature of the fluid $T_{fluid}$ has the same sign as the difference between the second Seebeck coefficient $S_B$ and the first Seebeck coefficient $S_A$).

In addition, the thermoelectric modules 13, 14, 15 being assembled in series, the potential differences $\Delta V$ are added to each other, so that across the rectifier 22, the external connectors 18a and 18b produce a potential difference equal to $\Delta V$ multiplied by the number of thermoelectric modules assembled in series in the thermoelectric generator 30. Thus, the interest is to assemble a large number of modules 13, 14, 15 in order to proportionally increase the production of electricity.

Figure 2:
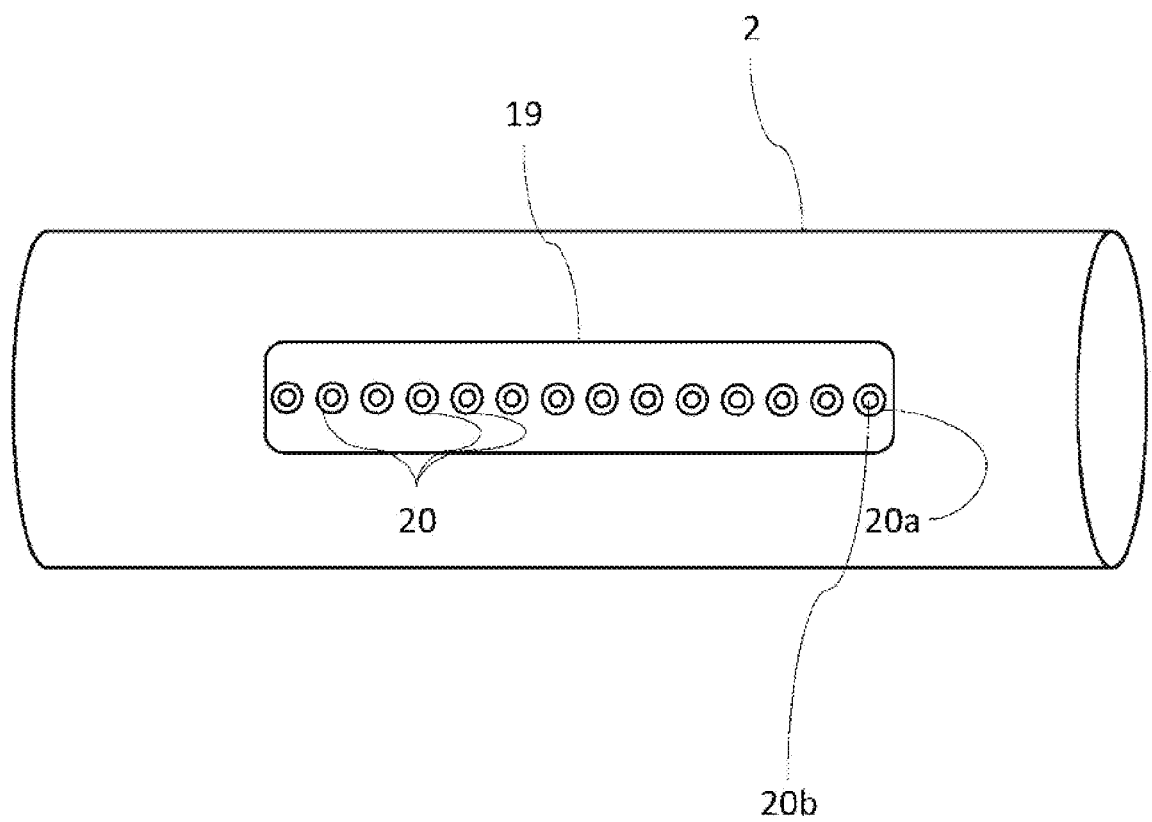
FIG. 2 is a top view of a first embodiment of the protrusion and the cavities of the fluid meter pipe.
Figure 3:
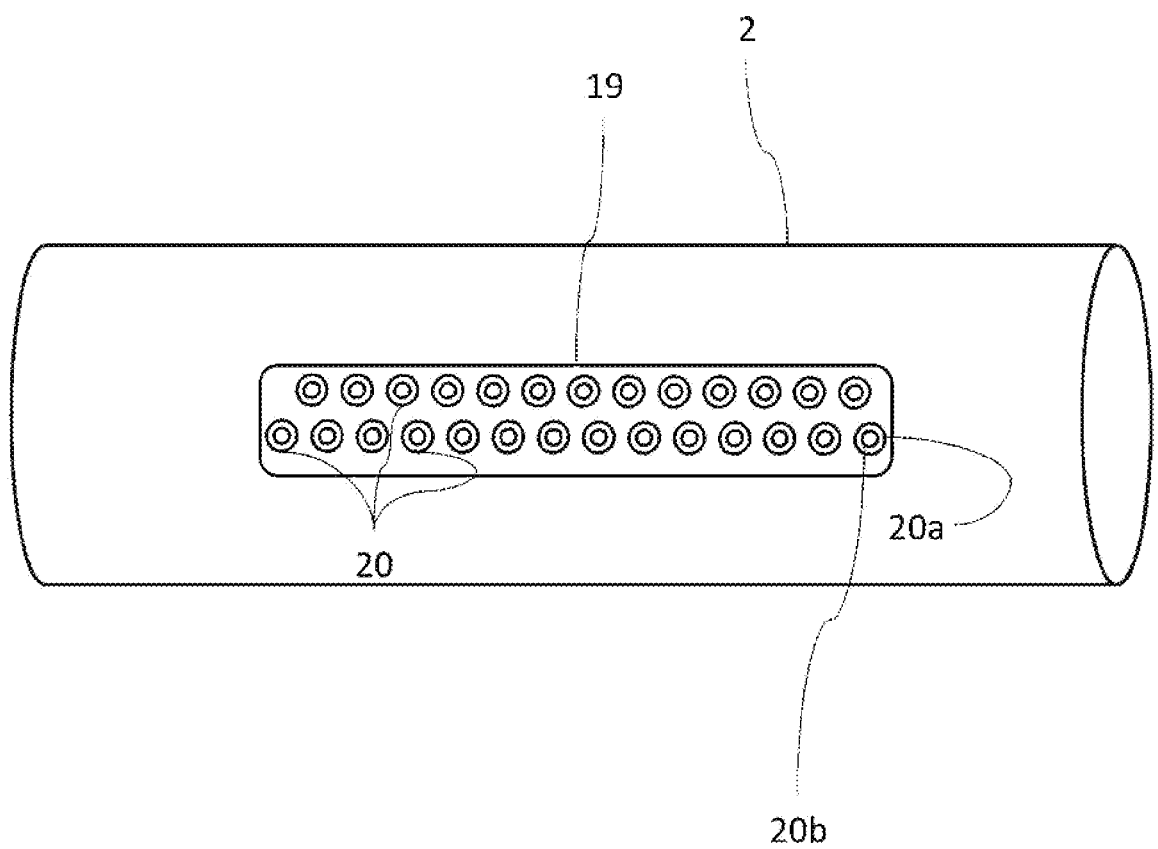
FIG. 3 is a top view of a second embodiment of the protrusion and the cavities of the fluid meter pipe.

For example, the thermoelectric generator 30 includes a number N worth 14 or 27 of thermoelectric modules 13, 14, 15, as represented in examples illustrated in FIGS. 2 and 3. However, the number N can take any other value depending on the constraints or the needs of the user.

In order to house the thermoelectric modules 13, 14, 15 and more generally the thermoelectric generator 30, the pipe 2 comprises a protrusion 19 formed on an external surface (that is to say in contact with the exterior) of the pipe 2 More specifically, the protrusion 19 extends radially outwards (that is to say in a direction opposite to the position of the fluid) from the pipe 2 relative to an axis of flow of the fluid in the pipe 2 represented by an arrow in the embodiment, an example of which is illustrated in FIG. 1.

The protrusion 19 comprises one or more cavities 20 forming housings configured to receive the thermoelectric modules 13, 14, 15. Particularly, each cavity 20 is configured to receive a thermoelectric module 13, 14, 15. In one embodiment, the protrusion 19 comprises as many cavities 20 as the thermoelectric generator 30 includes thermoelectric modules 13, 14, 15.

The cavities 20 can be made in the protrusion 19 so as to be aligned, as in the example illustrated in FIG. 2, or staggered, as in the example illustrated in FIG. 3, in order to be able to house more modules 13, 14, 15 in a small space. These examples are not limiting.

Each cavity 20 is blind and extends in the protrusion 19 radially relative to the axis of flow of the fluid. More specifically, each cavity 20 opens out onto the exterior of the pipe 2, and extends in the protrusion 19 to an interior point of the wall 3 of the pipe 2 sufficiently close to the fluid so that the bottom of the cavity 20 is substantially at the temperature of the fluid flowing in the pipe 2.

In one embodiment, each of the cavities 20 comprises a protection part 20a and a receiving part 20b superposed radially, the receiving part 20b constituting the deepest portion of the cavity 20 in the wall 3 of the pipe 2 including the protrusion 19 and therefore closest to the fluid. In other words, the protection part 20a extends between the opening end of the cavity 20 on the exterior of the pipe 2 and the receiving part 20b.

More specifically, the wall 3 of the pipe 2 has a first constant thickness E1 out of the protrusion 19. The protrusion 19 has a second thickness E2, so that the wall 3 has at the level of the protrusion 19 a thickness equal to the sum of the first and second thicknesses E1 and E2. The protection part 20b is more specifically arranged in the wall of the pipe 2 including the protrusion 19 at a distance E3 from the interior of the pipe 2 smaller than the first thickness E1. In other words, the wall 3 locally comprises a third thickness E3 at the level of each cavity 20, this third thickness E3 being smaller than the first thickness E1.

For example, the first thickness E1 is comprised between 2 and 5 millimeters, and is typically 3 millimeters, the second thickness E2 is comprised between 8 and 12 millimeters, and is typically 10 millimeters, and the distance E3, or third thickness E3, is comprised between 0.3 and 1.7 millimeters, and is typically 1 millimeter.

In one embodiment, the protection part 20a has a diameter D1 greater than the diameter D2 of the receiving part 20b. More specifically, the receiving part 20b of each cavity 20 is configured to enclose the second portion 17 of the module 13, 14, 15 inserted into said cavity 20, so as to hold and immobilize the module 13, 14, 15 in said cavity 20. Thus, the diameter D2 of the receiving part 20b is substantially close, for example greater by half a millimeter, to the diameter of the second portion 17 of the thermoelectric modules 13, 14, 15. For example, the diameter D2 is comprised between 1 and 3 millimeters, and is typically 2 millimeters.

The diameter of the protection part 20a is however wider, and configured so that no contact takes place between the module 13, 14, 15 and the protection part 20a, so as to electrically and thermally insulate the module 13, 14, 15 out of its second portion 17. For example, the diameter of the protection part 20a is comprised between 3 and 6 millimeters, and is typically 4 millimeters.

The radial thickness E2 of the protrusion 19 is configured so that the first portion 16 of the modules 13, 14, 15 inserted into the plurality of cavities 20 is exposed outside the pipe 2, that is to say out of the protection part 20a. In this way, the first portion 16 is well maintained at the temperature $T_{amb}$ of the exterior of the pipe 2.

The second portion 17 of each of the thermoelectric modules 13, 14, 15 is thus kept in contact with the receiving part 20b, located closest to the fluid flowing in the pipe 2, so that the second portion 17 is indeed at the temperature $T_{fluid}$ of the fluid. Optionally, an electrically insulating thermal gel is applied to the second portion 17, so that the heat conduction of the fluid to the second portion 17 is improved while avoiding electrical losses in contact with the pipe 2, which can comprise brass. Finally, the free space between the protection part 20a and the thermoelectric module 13, 14, 15 housed in said protection part 20a can be filled with air or with a thermal insulator. The first switch S1 and the second switch S2 are controlled by the control block 6 for their state: open or closed for the second switch S2, selection of the supply path for the first switch S1. When the second switch S2 is closed and the first switch S1 connects the control block 6 to the primary cell 12, which then powers the control block 6, the capacitor C1 is coupled to the thermoelectric generator 30 and recharges, storing electrical energy produced by the thermoelectric generator 30. When the second switch S2 is open and the first switch S1 connects the control block 6 to the capacitor C1 of the second supply path 21, the control block 6 is powered by the capacitor C1, the primary cell 12 not being loaded.

The second switch S2 is configured to be monitored by the control block 6 according to the temperature difference ΔT determined by the control block 6 on the one hand when the capacitor C1 is charging (in a charge state), and according to a state of charge of the capacitor C1 determined by the control block 6 on the other hand when the capacitor C1 is discharging (in a discharge state).

The first switch S1 is configured to be monitored by the control block 6 according to a state of charge of the capacitor C1 determined by the control block 6. A charge or discharge state of the capacitor C1 is determined by the control block 6 from an estimation of the current I representative of an intensity of the charge or discharge current of the capacitor C1, or an estimation of the charge or discharge current I.

More particularly, on the one hand, the estimation of the charge current I is carried out by the control block 6 and based on a correspondence between the temperature difference ΔT between the exterior of the pipe 2 and the fluid determined by the control block 6 and a first correspondence table (determined experimentally, and stored for example in the memory of the control block 6) providing for each value of ΔT an estimation of the current I.

On the other hand, the estimation of the discharge current I is carried out by the control block 6 and based on a correspondence between functions implemented by the control block 6 and a second correspondence table (determined experimentally, and stored for example in the memory of the control block 6) providing for each implemented function an estimation of the current I.

The control block 6 is indeed configured to determine a level of charge (SoC) of the capacitor C1 from this estimation of the charge or discharge current I. More specifically, the level of charge is updated at each time step thanks to the estimation of the charge or discharge current I.

For example, during the charging of the capacitor C1, the level of charge (SoC) at the previous instant is incremented by a multiple of the intensity of the charge current I. Preferably, the level of charge is expressed as a proportion of a maximum energy reserve $E_{max}$ of the capacitor C1. It follows that the expression for energy, i.e. V.I, is divided by $E_{max}$, with V the value of the voltage across the rectifier 22 delivered by the thermoelectric generator 30 (V being equal to ΔV multiplied by the number N of modules 13, 14, 15 assembled in series in the thermoelectric generator 30) and I the intensity of the charge current estimated by the control block 6 using the temperature difference ΔT and the first correspondence table, and therefore that SoC(t+T)=SoC(t)+T·V·I/$E_{max}$.

Conversely, during the discharging of the capacitor C1, the level of charge (SoC) at the previous instant is decremented by a multiple of the intensity of the discharge current I, hence SoC(t+T)=SoC(t)−T·V·I/$E_{max}$, with V the value of the voltage across the rectifier 22 delivered by the thermoelectric generator 30 (V being equal to ΔV multiplied by the number N of modules 13, 14, 15 assembled in series in the thermoelectric generator 30) and I the intensity of the discharge current estimated by the control block 6 using the functions implemented by the control block 6 and the second correspondence table.

Preferably, the time step T is less than 10 seconds. The time step T is preferably more than 0.1 second. For reasons of simplicity, the time step here is 1 second, which simplifies the determination of the level of charge:

$$\text{in charge: } SoC(t+T) = SoC(t) + V.I/E_{max},$$

$$\text{in discharge: } SoC(t+T) = SoC(t) - V.I/E_{max},$$

If the state of charge is sufficiently high, the first switch S1 connects the second supply path 21 to allow the supply of the control block 6 by the capacitor C1 of the second supply path 21. Otherwise, the first switch S1 connects the first supply path 11 to allow the recharging of the capacitor C1 while it is the primary cell 12 of the first supply path 11 that powers the control block 6. The control block 6 is configured, at least when the thermoelectric generator 30 generates electricity:

to position the first switch S1 on the second supply path 21 when the level of charge becomes greater than or equal to a high threshold, to position the first switch S1 on the first supply path 11 when the level of charge of the capacitor C1 becomes smaller than or equal to a low threshold.

Likewise, when the first switch S1 is connected to the primary cell 12, and therefore when the capacitor C1 is in the charge phase, the control block 6 is configured:

to open the second switch S2 when the temperature difference $\Delta T$ is in absolute value smaller than a minimum temperature difference threshold, to close the second switch S2 when the temperature difference $\Delta T$ is in absolute value greater than or equal to a minimum temperature difference threshold and when the temperature difference $\Delta T$ has the same sign as the difference defined by the second Seebeck coefficient $S_B$ minus the first Seebeck coefficient $S_A$.

The same minimum temperature threshold can be used, but it is possible to use different thresholds.

Figure 4:
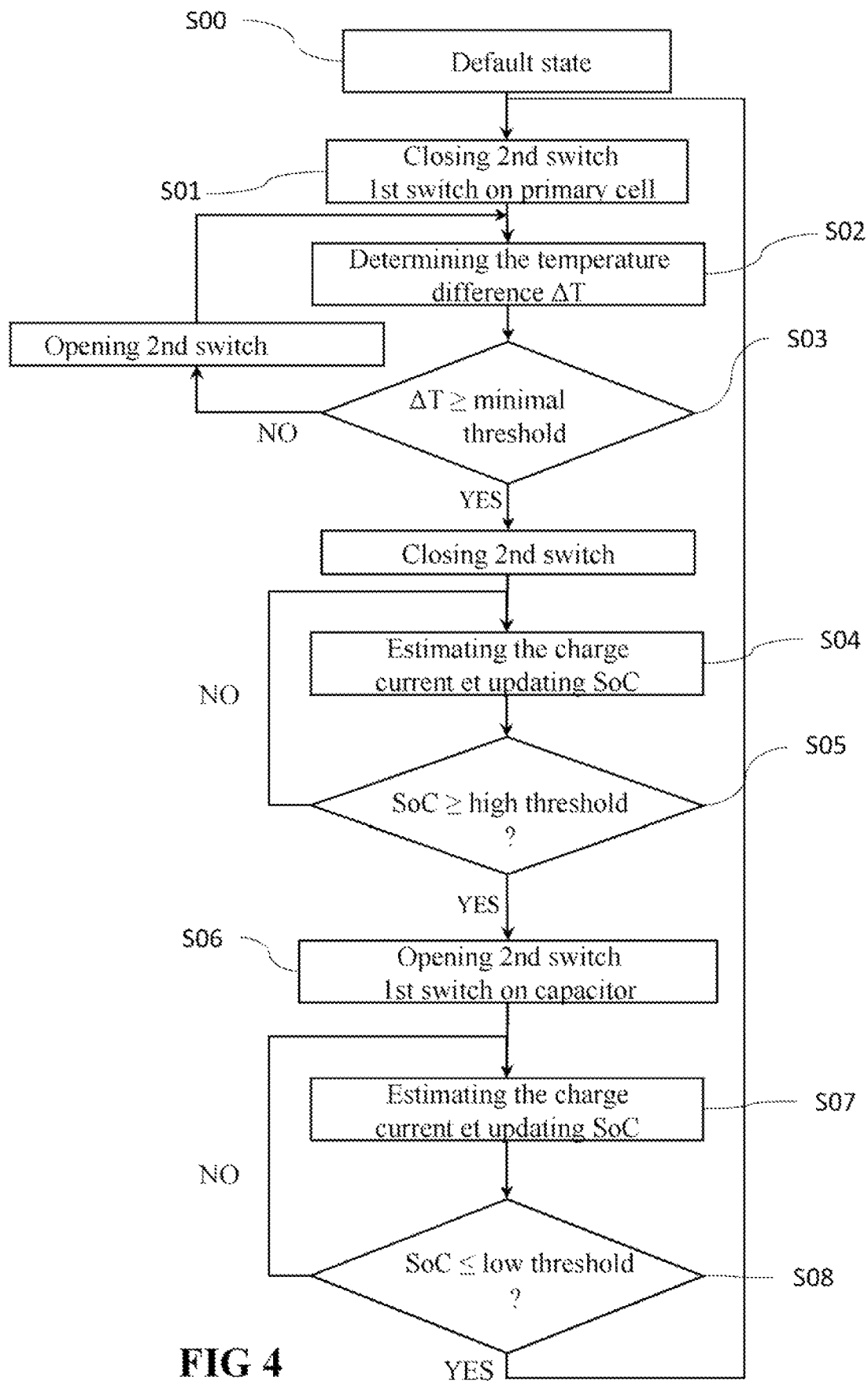
FIG. 4 is a fluid meter implementation diagram according to one possible embodiment of the invention.

FIG. 4 shows an example of a fluid meter operation diagram showing the variations in the states of the first switch S1 and of the second switch S2, with different steps implemented by the control block 6. In a default state (S00), for example before the installation of the fluid meter, the first switch S1 is on primary cell 12, that is to say connects the control block 6 to the first supply path 11. The second switch S2 is preferably closed. The charge of the capacitor C1 may be zero (in which case the level of charge is initialized to 0) or very low (in which case the level of charge is initialized according to the non-zero initial charge value). In a first step (S01), the second switch S2 is closed, connecting the capacitor C1 to the thermoelectric generator 30. The first switch S1 is on primary cell 12. The capacitor C1 can then be charged with electrical energy. In a second step (S02), the temperature difference $\Delta T$ between the exterior of the pipe 2 and the fluid is measured by the control block 6 receiving the measurements $T_{amb}$ and $T_{fluid}$ made by the temperature sensors T1 and T2. The temperature difference $\Delta T$ is compared to a minimum temperature difference threshold, in order to determine whether electricity is produced by the thermoelectric generator 30 in sufficient quantity to charge the capacitor C1. Depending on the result of the comparison of the second step (S02), the second switch S2 is open or closed (step S03). Thus, if the temperature difference $\Delta T$ is in absolute value smaller than the minimum threshold, then the second switch S2 is open. Conversely, if the temperature difference $\Delta T$ is in absolute value greater than or equal to a minimum threshold (the same or different) and if the temperature difference $\Delta T$ has the same sign as the difference between the second Seebeck coefficient $S_B$ and the first Seebeck coefficient $S_A$, then the second switch S2 is closed, allowing the charging of the capacitor C1. For example, the minimum temperature difference threshold is comprised between 2° C. and 5° C., and typically 3° C.

When the second switch S2 is closed, a fourth step (S04) is implemented, in which the control block 6 estimates the charge current I according to the temperature difference $\Delta T$ and to the first correspondence table, and updates the level of charge according to the estimation of the determined charge current I. More specifically, as explained above, the state of charge is incremented by a multiple of the estimation of the charge current I. Then, a test (S05) is performed to check whether the level of charge is greater than or equal to a high threshold, by means of a comparison between the current level of charge and this high threshold. The high threshold is used to check that the capacitor C1 is sufficiently charged, and therefore corresponds to a level of charge close to the maximum energy $E_{max}$ that the capacitor can store. Typically, the high threshold is at least 80% of the maximum energy $E_{max}$, and preferably at least 90% of the maximum energy $E_{max}$.

If this is not the case, the control block 6 returns to the fourth step (S04) to continue the charging of the capacitor C1. If the level of charge is greater than or equal to the high threshold, then the control block 6 controls the opening second switch S2 and the passage of the first switch S1 on the capacitor C1, thus coupling the control block 6 and the second supply path 21 (step S06). The control block 6 is now powered by the capacitor C1 which discharges, and no longer by the primary cell 12. The opening of the first switch S2 makes it possible to decouple the capacitor C1 and the thermoelectric generator 30 thus avoiding possible electrical disturbances. During the discharge of the capacitor C1, at each time step T, a step (S07) of estimating the discharge current I and an update of the level of charge by the control block 6 are performed. More particularly, this estimation of the discharge current I is determined by the control block 6 differently than in step S03. Indeed, the estimation of the current I is determined from the active functions in the time step of step S05 and from the second correspondence table. More specifically, by active functions it is meant the functions implemented by the control block 6 (such as the activation of the control block 6, the sending of a frame, the production of a measurement burst, . . . ). On the other hand, as explained above, the level of charge is decremented by a multiple of the estimation of the discharge current I. Then, a test (S08) is carried out to check whether the level of charge is smaller than or equal to a low threshold, by means of a comparison between the current level of charge and this low threshold. The low threshold is used to check that the capacitor C1 has been sufficiently discharged, and therefore corresponds to a level of charge close to the minimum. Typically, the low threshold is less than 10% of the maximum energy $E_{max}$, and is for example less than or equal to 5% of $E_{max}$.

If the level of charge is greater than the low threshold, the discharge of the capacitor C1 continues and a new step (S07) of estimating the discharge current I and updating the level of charge is performed. Conversely, if the level of charge is smaller than or equal to the low threshold, this means that the capacitor C1 has been sufficiently discharged, and that it must now be recharged. Consequently, the control block 6 then returns to step (S01), closes the second switch S2 and switches the first switch S1 to the first supply path 11, on the primary cell 12.

Finally, the control block 6 is configured to implement a computer program product including instructions which, when executed by the control block 6, leads to the implementation of the method described above.

The computer program product takes the form of a non-volatile medium, typically a computer-readable memory storing instructions which, when executed by a computer, cause it to implement the method described above As visible in this method, the control block 6 is configured to maximize the use of the capacitor C1 and save the primary cell 12. The primary cell 12 is then only used to allow the recharging of the capacitor C1. Thanks to the permanence of the electrical supply, the fluid meter is capable of communicating information relating to the metrological data, for example by displaying them, even in the absence of fluid circulation. It should be noted that the charging time of the capacitor C1 is inversely proportional to the temperature difference ΔT between the exterior and the fluid, so that the invention is particularly suitable for a hot water meter. It is easy to ensure, given the low energy requirements of the control block 6, that the recharging time of the capacitor C1 is much shorter than the discharging time of the capacitor C1. The capacitor C1 can ensure a significant part of the supply to the control block 6. The primary cell 12, less loaded, can be chosen with a lower energy storage capacity, with consequently reduced bulk and lower cost, while preserving or increasing its service life.

The thermoelectric generator 30 used in the present invention has the advantage of not being intrusive into the fluid, and thus not risking to disturb the accuracy of the metrology. Also, such a thermoelectric generator 30 eliminates any risk of breakage or clogging compared to another intrusive electric generator.

Also, the solution presented in the present disclosure is cost-effective, the additional cost related to the manufacture of the protrusion and to the drilling of the cavities being very limited.

The invention is not limited to the embodiment described and represented in the appended figures. Modifications remain possible, particularly from the point of view of the constitution of the various technical characteristics or by substitution of technical equivalents, without departing from the field of protection of the invention.

The invention claimed is:

1. A fluid meter configured to perform metrological measurements in a fluid circulation pipe and to communicate information relating to said metrological data, comprising:
   a fluid pipe,
   at least one metrological sensor configured to perform metrological measurements in the fluid pipe,
   a control block configured to receive the metrological measurements and to communicate information relating to said metrological data,
   a power supply block configured to supply energy to the control block, the power supply block comprising a first supply path comprising at least one primary cell, and a second supply path, the power supply block further comprising a first switch configured to selectively couple the first supply path or the second supply path to the control block, characterized in that the fluid meter comprises a thermoelectric generator configured to produce electricity from a temperature difference between an exterior of the pipe and the fluid in the pipe, the second supply path being connected to the thermoelectric generator, the second supply path comprising a capacitor and a second switch configured to selectively couple the capacitor and the thermoelectric generator according to a level of charge of the capacitor.

2. The fluid meter according to claim 1, wherein the thermoelectric generator includes one or more thermoelectric modules partially inserted into a wall of the pipe.

3. The fluid meter according to claim 2, wherein a protrusion is formed on the fluid circulation pipe, the protrusion comprising at least one cavity, each cavity being configured to receive a thermoelectric module.

4. The fluid meter according to claim 3, wherein the wall of the pipe has a first thickness out of the protrusion, each cavity comprising a protection part and a receiving part, the receiving part being of a diameter smaller than the protection part and being arranged in the wall of the pipe at a distance from the interior of the pipe smaller than the first thickness, each thermoelectric module comprising a first portion configured to be at the temperature of the exterior of the pipe and a second portion configured to be at the temperature of the fluid, the second portion being inserted into the receiving part.

5. The fluid meter according to claim 4, wherein the thermoelectric generator includes a first external connector in contact with the first portion of a first thermoelectric module disposed at an input of the thermoelectric generator and connecting said first portion to the power supply block, the thermoelectric generator further comprising a second external connector in contact with the second portion of a last thermoelectric module disposed at an output of the thermoelectric generator and connecting said second portion to the power supply block.

6. The fluid meter according to claim 5, wherein each thermoelectric module is composed of a first thermoelectric material having a first Seebeck coefficient, and a connector in contact with the first portion or the second portion of the thermoelectric module is composed of a second thermoelectric material having a second Seebeck coefficient different from the first Seebeck coefficient.

7. The fluid meter according to claim 4, wherein a second portion of a thermoelectric module is connected by an internal connector to the first portion of another thermoelectric module.

8. The fluid meter according to claim 1, wherein the level of charge is determined by the control block according to a first correspondence table and to the temperature difference when the capacitor is charging, and according to a second correspondence table and to functions implemented by the control block when the capacitor is discharging.

9. The fluid meter according to claim 1, wherein the control block is configured, at least when the thermoelectric generator generates electricity:
   to position the first switch on the second supply path when the level of charge becomes greater than a high threshold,
   to position the first switch on the first supply path when the level of charge of the capacitor becomes smaller than a low threshold.

10. The fluid meter according to claim 9, wherein the high threshold is greater than or equal to 80% of a maximum level of charge, and the low threshold is less than or equal to 10% of a maximum level of charge.

11. The fluid meter according to claim 1, wherein the control block is configured to determine a temperature difference between the exterior of the pipe and the fluid and:
   to open the second switch when the temperature difference is smaller than a minimum temperature difference threshold,
   to close the second switch when the temperature difference is greater than or equal to a minimum temperature difference threshold.

12. The fluid meter according to claim 11, wherein the minimum temperature difference threshold is comprised between 2° C. and 5° C.

13. A method for managing the supply of a fluid meter according to claim 1, the fluid meter comprising a control block and a power supply block configured to supply energy to the control block, the power supply block comprising a first supply path comprising at least one primary cell, and a second supply path, the power supply block further comprising a first switch configured to selectively couple the first supply path or the second supply path to the control block, the second supply path being connected to a thermoelectric generator configured to produce electricity from a temperature difference between an exterior of the pipe and the fluid in the pipe, the second supply path further comprising a capacitor and a second switch configured to selectively couple the capacitor and the thermoelectric generator according to a level of charge of the capacitor, the method being able to be implemented by the control block and including the following steps:

switching the first switch on the first supply path, determining a temperature difference between an exterior of the pipe and the fluid and, when the determined temperature difference becomes greater than or equal to a minimum threshold, closing the second switch, estimating a charge current from the temperature difference and a first correspondence table providing an estimation of the associated charge current for each value of the temperature difference, determining a level of charge of the capacitor in charge from the estimated charge current and, when the estimated level of charge becomes greater than or equal to a predetermined high threshold, switching the first switch on the second supply path, estimating a discharge current from functions implemented by the control block and a second correspondence table providing for each function implemented by the control block an estimation of the associated discharge current, determining a level of charge of the capacitor in discharge according to the estimation of the discharge current and, when the estimated level of charge becomes smaller than or equal to a predetermined low charge threshold, repeating the previous steps.

14. A computer program product able to be implemented by a control block of a fluid meter, comprising instructions which, when the program is executed by the control block, cause the control block to implement the method according to claim 13.

15. A computer-readable memory storing instructions executable by the computer for the execution of the steps of the method according to claim 13.

\* \* \* \* \*